(12) United States Patent
Hu (10) Patent No.: US 11,419,222 B2
(45) Date of Patent: Aug. 16, 2022

(54) METHOD OF MANUFACTURING CIRCUIT BOARD

(71) Applicant: Unimicron Technology Corp., Taoyuan (TW)

(72) Inventor: Hsin-Chi Hu, Pingtung County (TW)

(73) Assignee: Unimicron Technology Corp., Taoyuan (TW)

( * ) Notice: Subject to any disclaimer, the term of this patent is extended or adjusted under 35 U.S.C. 154(b) by 434 days.

(21) Appl. No.: 16/784,219

(22) Filed: Feb. 6, 2020

(65) Prior Publication Data

US 2020/0178400 A1    Jun. 4, 2020

Related U.S. Application Data

(62) Division of application No. 16/218,508, filed on Dec. 13, 2018.

(30) Foreign Application Priority Data

Oct. 29, 2018  (TW) .................................. 107138236

(51) Int. Cl.
*H05K 3/46* (2006.01)
*H05K 3/42* (2006.01)
(Continued)

(52) U.S. Cl.
CPC .......... *H05K 3/4652* (2013.01); *H05K 1/115* (2013.01); *H05K 3/0026* (2013.01); *H05K 3/244* (2013.01);
(Continued)

(58) Field of Classification Search
CPC ........ H05K 1/11; H05K 1/115; H05K 3/0026; H05K 3/244; H05K 3/4038; H05K 3/423;
(Continued)

(56) References Cited

U.S. PATENT DOCUMENTS 6,809,415 B2   10/2004  Tsukada et al.
7,093,356 B2    8/2006  Imafuji et al.
(Continued)

FOREIGN PATENT DOCUMENTS

CN        1491076 A    4/2004
CN      103857204 A    6/2014
(Continued)

*Primary Examiner* — Carl J Arbes
(74) *Attorney, Agent, or Firm* — CKC & Partners Co., LLC (57) ABSTRACT

A method of manufacturing a circuit board includes: providing a substrate including a bottom layer and a resin layer over the bottom layer, the resin layer including a first surface in contact with the bottom layer and a second surface opposite to the first surface; forming a plurality of vias through the resin layer; depositing a first metal layer in the vias, the first metal layer filling a portion of each of the vias; depositing a second metal layer over the first metal layer and in the vias; forming a patterned metal layer over the second metal layer and extending from each of the vias to a position over the second surface; separating the bottom layer and the resin layer; and removing a portion of the resin layer from the first surface, so that the first metal layer protrudes from the resin layer.

8 Claims, 14 Drawing Sheets

(51) Int. Cl.
*H05K 3/00* (2006.01)
*H05K 1/11* (2006.01)
*H05K 3/24* (2006.01)
*H05K 3/40* (2006.01)

(52) U.S. Cl.
CPC .......... *H05K 3/4038* (2013.01); *H05K 3/423* (2013.01); *H05K 1/11* (2013.01); *H05K 2203/0361* (2013.01); *H05K 2203/0723* (2013.01)

(58) Field of Classification Search
CPC ......... H05K 3/4652; H05K 2203/0361; H05K 2203/0723
See application file for complete search history.

(56) References Cited

U.S. PATENT DOCUMENTS

| | | | | |
|---|---|---|---|---|
| 9,951,434 | B2* | 4/2018 | Furutani | ................ H05K 1/115 |
| 2010/0155116 | A1 | 6/2010 | Kawai et al. | |
| 2010/0295191 | A1 | 11/2010 | Kikuchi et al. | |
| 2011/0042128 | A1 | 2/2011 | Hsu | |
| 2012/0124830 | A1 | 5/2012 | Cheng et al. | |
| 2013/0074332 | A1 | 3/2013 | Suzuki | |
| 2013/0140692 | A1 | 6/2013 | Kaneko et al. | |
| 2014/0262447 | A1* | 9/2014 | Katsuda | ................ H05K 1/185 |
| | | | | 174/251 |
| 2015/0340309 | A1* | 11/2015 | Furutani | ............. H01L 21/4857 |
| | | | | 174/251 |
| 2017/0186677 | A1 | 6/2017 | Imafuji et al. | |

FOREIGN PATENT DOCUMENTS

| | | | |
|---|---|---|---|
| CN | 103904050 A | | 7/2014 |
| CN | 108257875 A | | 7/2018 |
| JP | H08124965 A | | 5/1996 |
| JP | 3811680 B | * | 8/2006 |
| JP | 4056668 B | * | 3/2008 |
| JP | 4332162 B | * | 6/2009 |
| TW | I333687 B | | 11/2010 |
| TW | I393233 B1 | | 4/2013 |

* cited by examiner

METHOD OF MANUFACTURING CIRCUIT BOARD

CROSS-REFERENCE TO RELATED APPLICATION

This application is a divisional application of U.S. application Ser. No. 16/218,508, filed Dec. 13, 2018, which claims priority to Taiwan Application Serial Number 107138236, filed Oct. 29, 2018, all of which are herein incorporated by reference.

BACKGROUND

Field of Invention

The present disclosure relates to a method of manufacturing a circuit board.

Description of Related Art

The fine bump pitch of the circuit board is one of the focuses of current application research and development. However, since the accuracy of the alignment of the exposure cannot be reduced, the use of a solder plated over pad (SPOP) method to form metal bumps over a circuit board or a substrate has been a technical bottleneck. Therefore, there is a need for a novel fabrication method to significantly reduce the fine bump pitch.

SUMMARY

An aspect of the present disclosure provides a method of manufacturing a circuit board, which includes operations below: providing a substrate, the substrate including a bottom layer and a resin layer over the bottom layer, the resin layer including a first surface and a second surface opposite to the first surface, the first surface in contact with the bottom layer; forming a plurality of vias through the resin layer; depositing a first metal layer in the vias, the first metal layer in contact with the bottom layer and filling a portion of each of the vias; depositing a second metal layer over the first metal layer, the second metal layer disposed in the vias; forming a patterned metal layer over the second metal layer, in which the patterned metal layer extends from each of the vias to a position over the second surface; separating the bottom layer and the resin layer; and removing a portion of the resin layer from the first surface, so that the first metal layer protrudes from the resin layer.

According to one or more embodiments of the present disclosure, the bottom layer includes a core layer, a first copper layer, a second copper layer and a release layer, in which the first copper layer is over the core layer, and the release layer is over the first copper layer, and the second copper layer is over the release layer, and the resin layer is over the second copper layer.

According to one or more embodiments of the present disclosure, the operation of separating the bottom layer and the resin layer includes separating the first copper layer and the second copper layer by the release layer.

According to one or more embodiments of the present disclosure, the second copper layer is etched after separating the first copper layer and the second copper layer by the release layer.

According to one or more embodiments of the present disclosure, an aperture size of each of the vias adjacent to the first surface is smaller than an aperture size of each of the vias adjacent to the second surface.

According to one or more embodiments of the present disclosure, forming the vias is conducted by laser drilling or exposure development.

According to one or more embodiments of the present disclosure, the operation of etching the resin layer includes forming a void between the resin layer and the first metal layer.

According to one or more embodiments of the present disclosure, the method further includes reflowing the first metal layer after etching the resin layer.

Another aspect of the present disclosure provides a circuit board, which includes a resin layer, a first metal layer, a second metal layer and a patterned metal layer. The resin layer includes a first surface and a second surface, in which the resin layer includes a plurality of vias through the resin layer. The first metal layer is disposed in each of the vias, in which the first metal layer protrudes from the first surface of the resin layer, and a void exists between the first metal layer and the resin layer. The second metal layer is disposed in each of the vias, in which the first metal layer is disposed at one side of the second metal layer. The patterned metal layer is disposed in each of the vias and at another side of the second metal layer opposite to the side, and the patterned metal layer covers a portion of the second surface of the resin layer.

According to one or more embodiments of the present disclosure, a material of the first metal layer is different from a material of the second metal layer.

According to one or more embodiments of the present disclosure, an aperture size of each of the vias adjacent to the first surface is smaller than an aperture size of each of the vias adjacent to the second surface.

BRIEF DESCRIPTION OF THE DRAWINGS

The disclosure will be better understood from the following detailed description when read in the claims. It should be emphasized that, depending over the standard practice in the industry, the features are not drawn to scale and are for illustrative purposes only. In fact, the size of the feature can be arbitrarily increased or decreased for the purpose of clarity.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, dimensions of the elements are not limited by the scope or value of the disclosure, but may depend over process conditions and/or characteristics of the elements. In addition, the formation of a first feature over or over a second feature in the description that follows may include embodiments in which the first and second features are formed in direct contact, and may also include embodiments in which additional features may be formed between the first and second features, such that the first and second features may not be in direct contact. For simplicity and clarity, different features may be arbitrarily drawn to different sizes.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a method of manufacturing a circuit board, which is capable of fabricating a circuit board with a narrow bump pitch, and the circuit board can be applied to a more advanced packaging processes.

Figure 1:
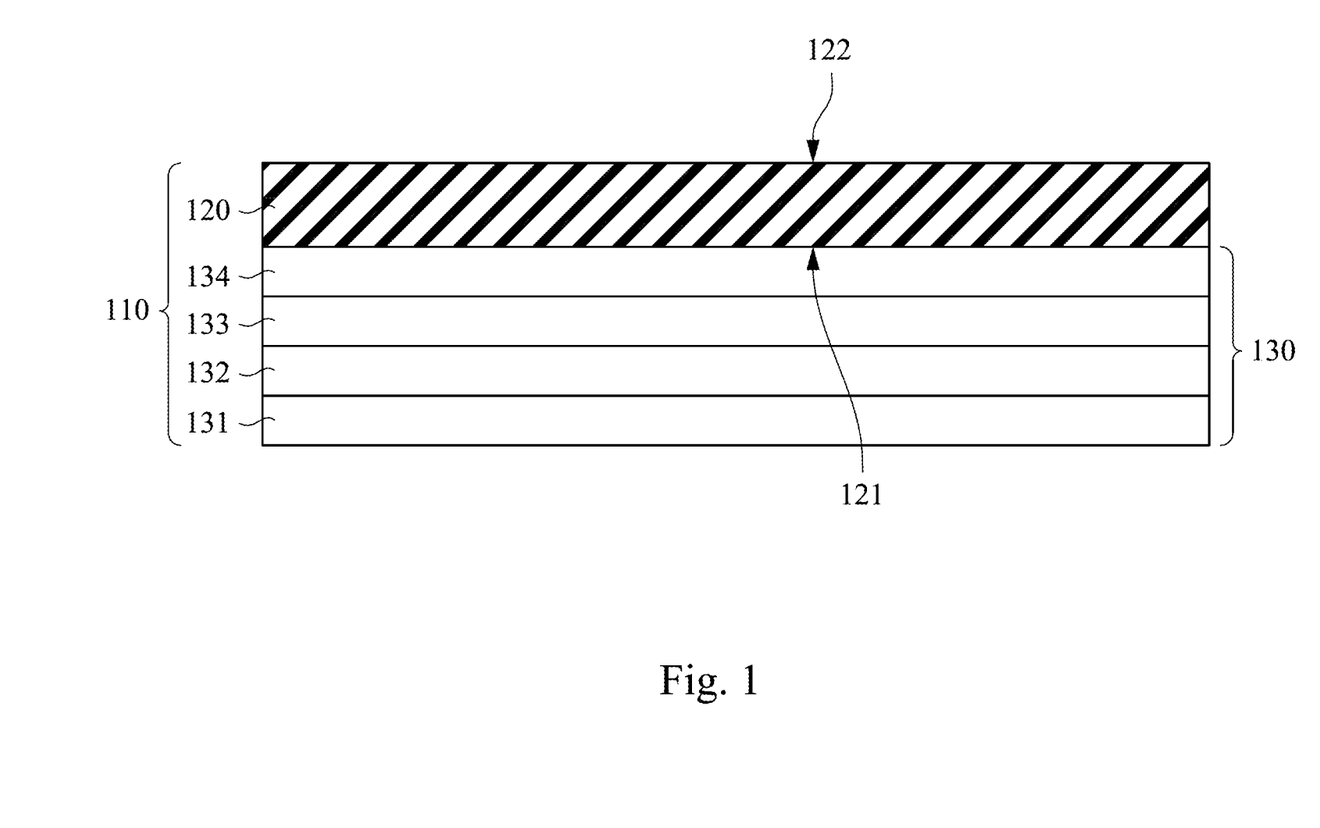
FIGS. 1-14 are cross-sectional views showing various stages of a method of manufacturing a circuit board according to various embodiments of the present disclosure.

FIGS. 1-14 are cross-sectional views showing various stages of a method of manufacturing a circuit board according to various embodiments of the present disclosure. First, as shown in FIG. 1, a substrate 110 is provided. The substrate 110 includes a resin layer 120 and a bottom layer 130. In some embodiments, the resin layer 120 is disposed over the bottom layer 130. The resin layer 120 includes a first surface 121 and a second surface 122, in which the first surface 121 is in contact with the bottom layer 130. The first surface 121 is opposite to the second surface 122.

In some embodiments, the bottom layer 130 includes a core layer 131, a first copper layer 132, a second copper layer 134, and a release layer 133. The first copper layer 132 is disposed over the core layer 131, and the release layer 133 is disposed over the first copper layer 132, and the second copper layer 134 is disposed over the release layer 133, and the resin layer 120 is disposed over the second copper layer 134. In other words, the release layer 133 is located between the first copper layer 132 and the second copper layer 134. The second copper layer 134 is in contact with the first surface 121 of the resin layer 120.

Figure 2:
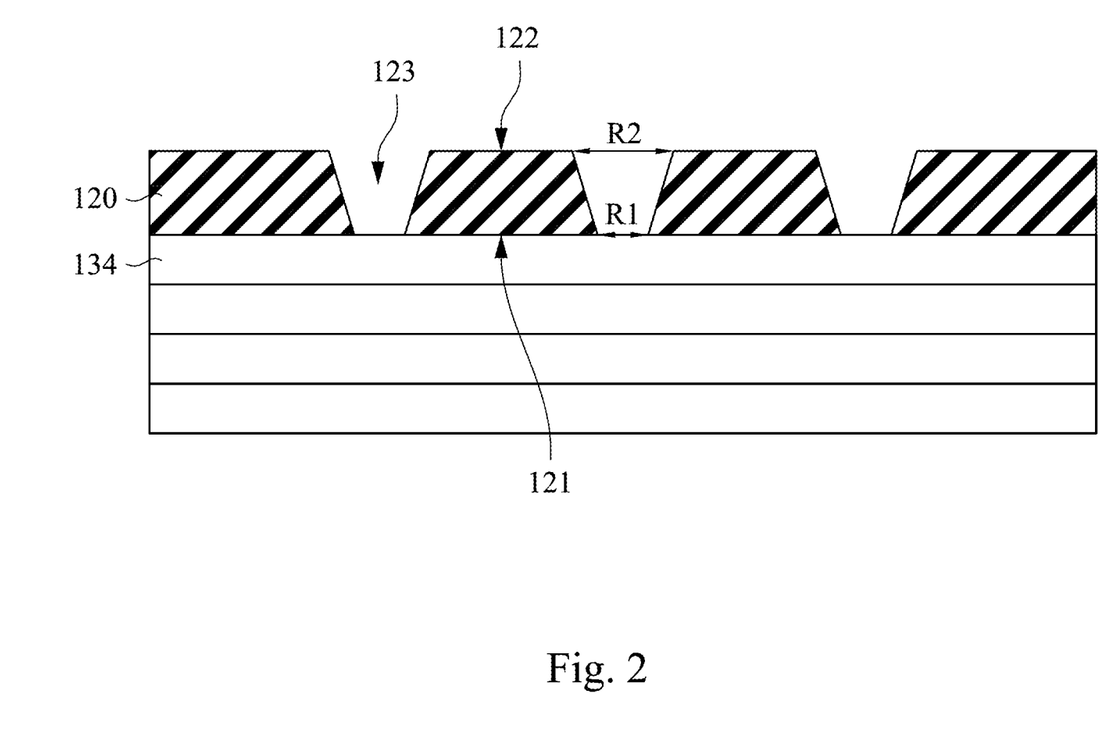

Next, as shown in FIG. 2, a plurality of vias 123 are formed in the resin layer 120, in which the vias 123 are through the resin layer 120. In addition, in certain embodiments, the via 123 is truncated cone-shaped. In the via 123, an aperture size R1 adjacent to a side of the first surface 121 is smaller than an aperture size R2 adjacent to a side of the second surface 122. In some embodiments, the via 123 exposes a portion of the second copper layer 134. In some embodiments, the vias 123 may be formed using laser drilling. In other embodiments, a material of the resin layer 120 is a photosensitive dielectric material, and thus the vias 123 may be formed using exposure development.

Figure 3:
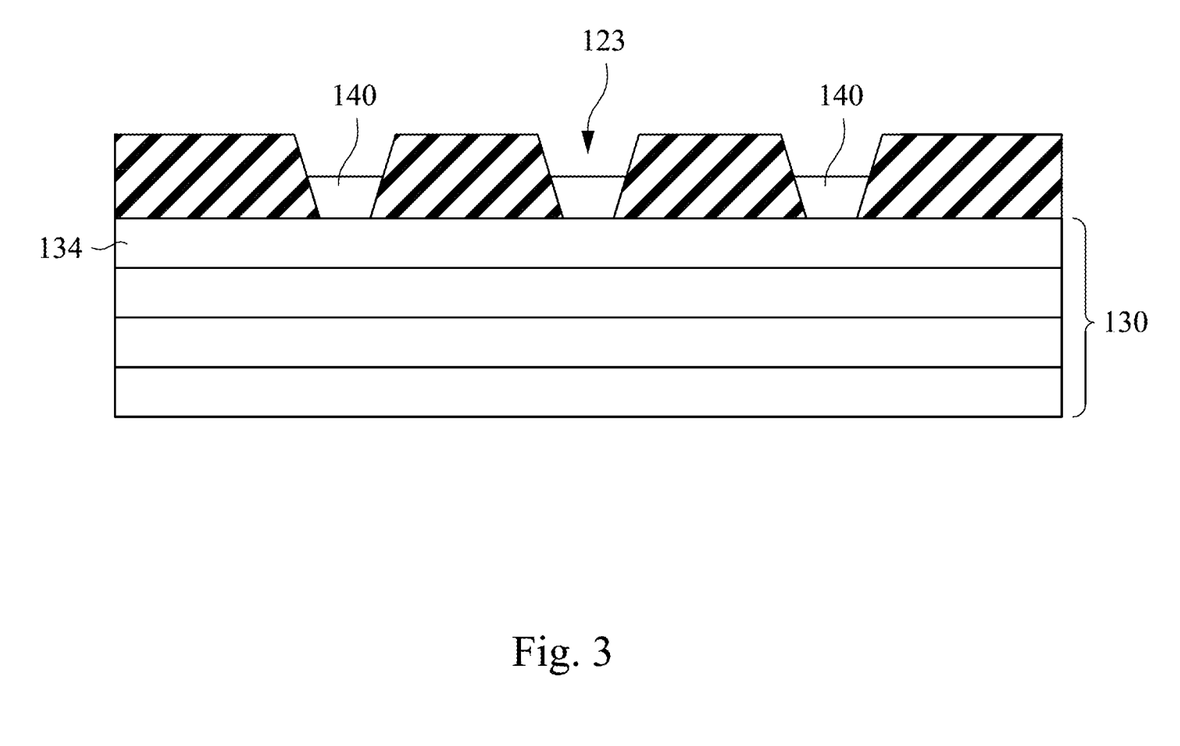

Next, as shown in FIG. 3, a first metal layer 140 is deposited in the vias 123, in which the first metal layer 140 is in contact with the bottom layer 130 and fills a portion of the via 123. In other words, the first metal layer 140 does not fill the entire via 123. Since the via 123 exposes a portion of the second copper layer 134, the first metal layer 140 is in contact with the exposed second copper layer 134. In some embodiments, the first metal layer 140 is made of a metal other than copper. More specifically, there is an etch selectivity between the metal used in the first metal layer 140 and the copper. In some embodiments, the first metal layer 140 is made of tin. In some other embodiments, depositing the first metal layer 140 may be conducted by electroplating.

Figure 4:
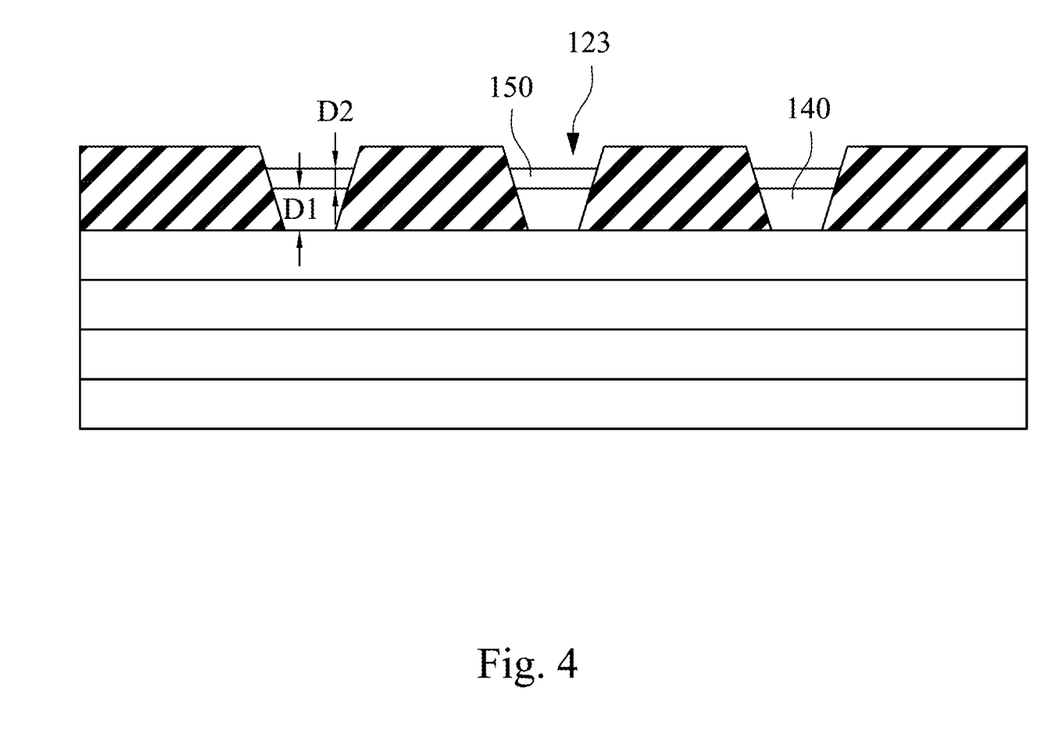

Subsequently, as shown in FIG. 4, a second metal layer 150 is deposited over the first metal layer 140, in which the second metal layer 150 is disposed in the vias 123. In some embodiments, the second metal layer 150 may be made of a material that prevents the first metal layer 140 from interacting with copper, in which the second metal layer 150 may be a metal or a conductive material. In some other embodiments, depositing the second metal layer 150 may be conducted by electroplating. In some embodiments, the first metal layer 140 and the second metal layer 150 do not fill the vias 123. In some embodiments, a thickness D2 of the second metal layer 150 is less than a thickness D1 of the first metal layer 140.

Next, a patterned metal layer is formed over the second metal layer 150. FIGS. 5-9 are cross-sectional views showing the formation of the patterned metal layer described above in accordance with some embodiments of the present disclosure.

Figure 5:
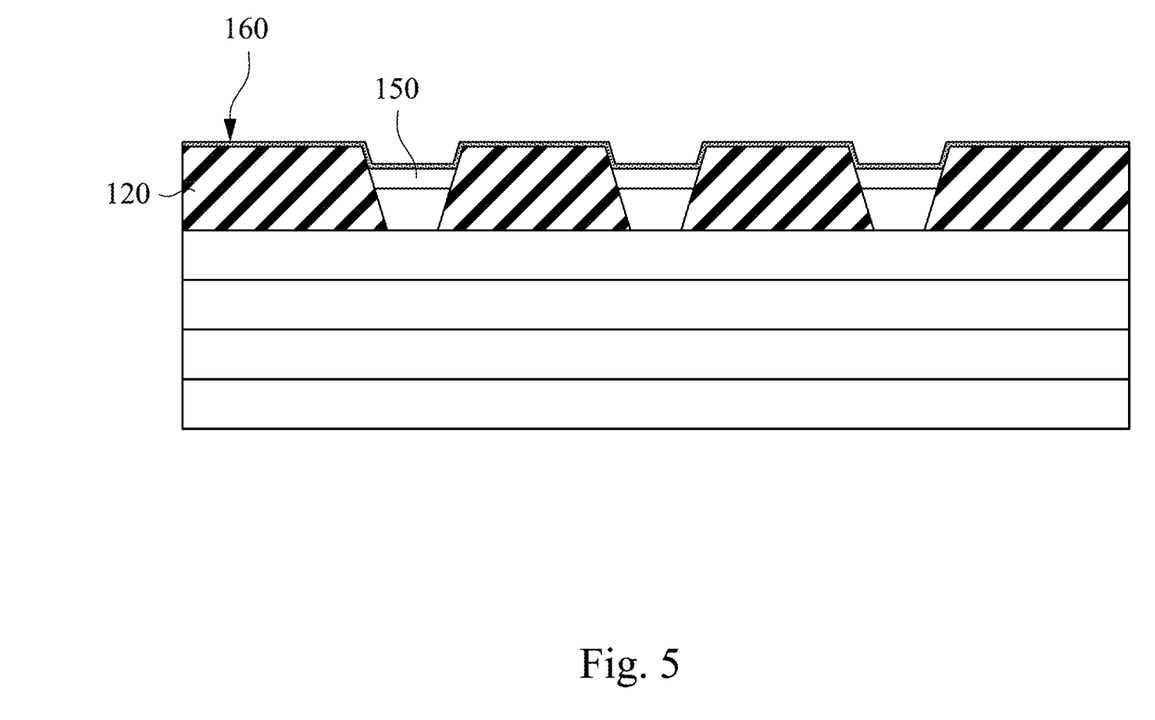

Referring to FIG. 5, a seed layer 160 is formed over the resin layer 120 and the second metal layer 150. In some embodiments, the seed layer 160 is conformally deposited over the resin layer 120 and the second metal layer 150. The seed layer 160 covers a surface of the resin layer 120 and a surface of the second metal layer 150. In some embodiments, the seed layer 160 is made of copper.

Figure 6:
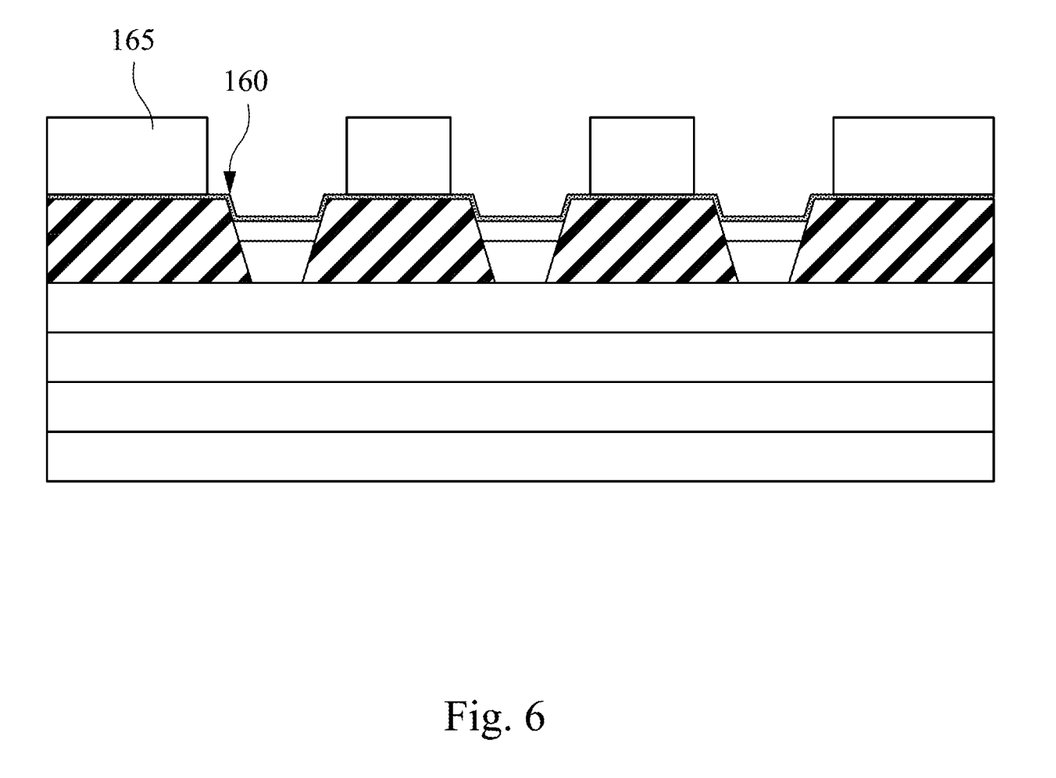

As shown in FIG. 6, a patterned photoresist layer 165 is formed over the seed layer 160. To further illustrate, the patterned photoresist layer 165 only covers a portion of the seed layer 160 and exposes another portion of the seed layer 160. In some embodiments, forming the patterned photoresist layer 165 includes steps of deposition, exposure and development.

Figure 7:
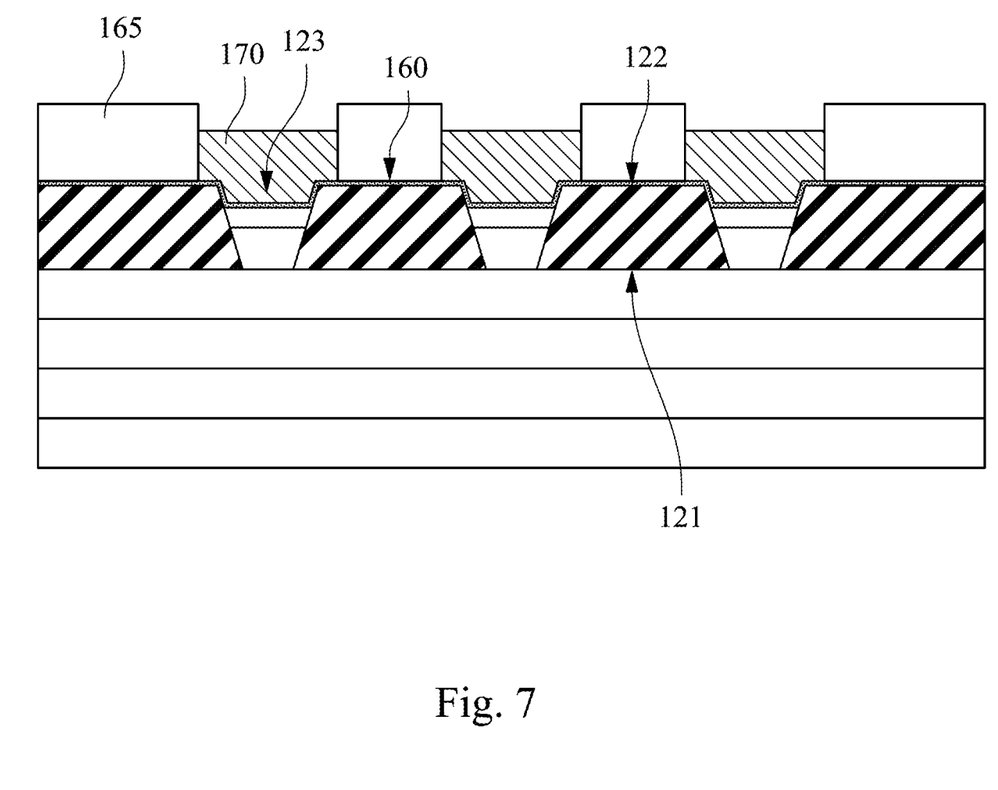

Next, as shown in FIG. 7, a metal block 170 is deposited over the seed layer 160 exposed from the patterned photoresist layer 165. A portion of the metal block 170 is located in the via 123, and a remaining portion of the metal block 170 is located over the second surface 122 adjacent to the via 123. In some embodiments, the metal block 170 is made of copper.

Figure 8:
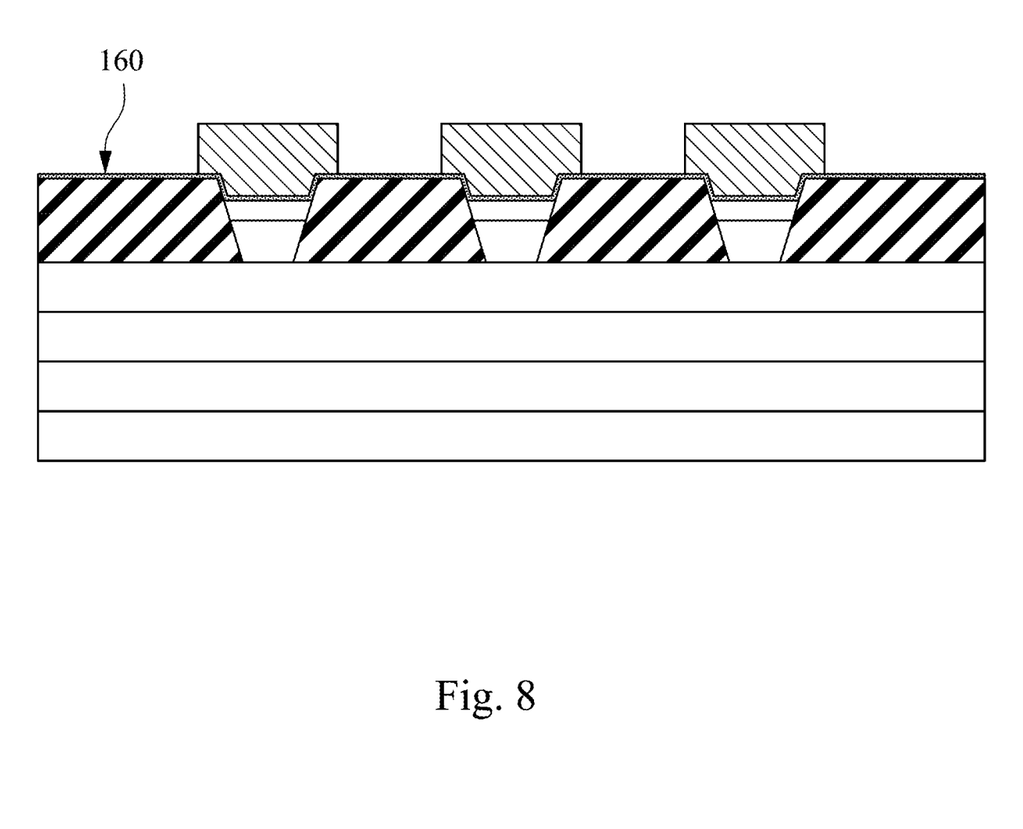

Subsequently, as shown in FIG. 8, the patterned photoresist layer 165 is removed. The patterned photoresist layer 165 may be removed using any suitable method. After the patterned photoresist layer 165 is removed, a portion of the seed layer 160 is exposed.

Figure 9:
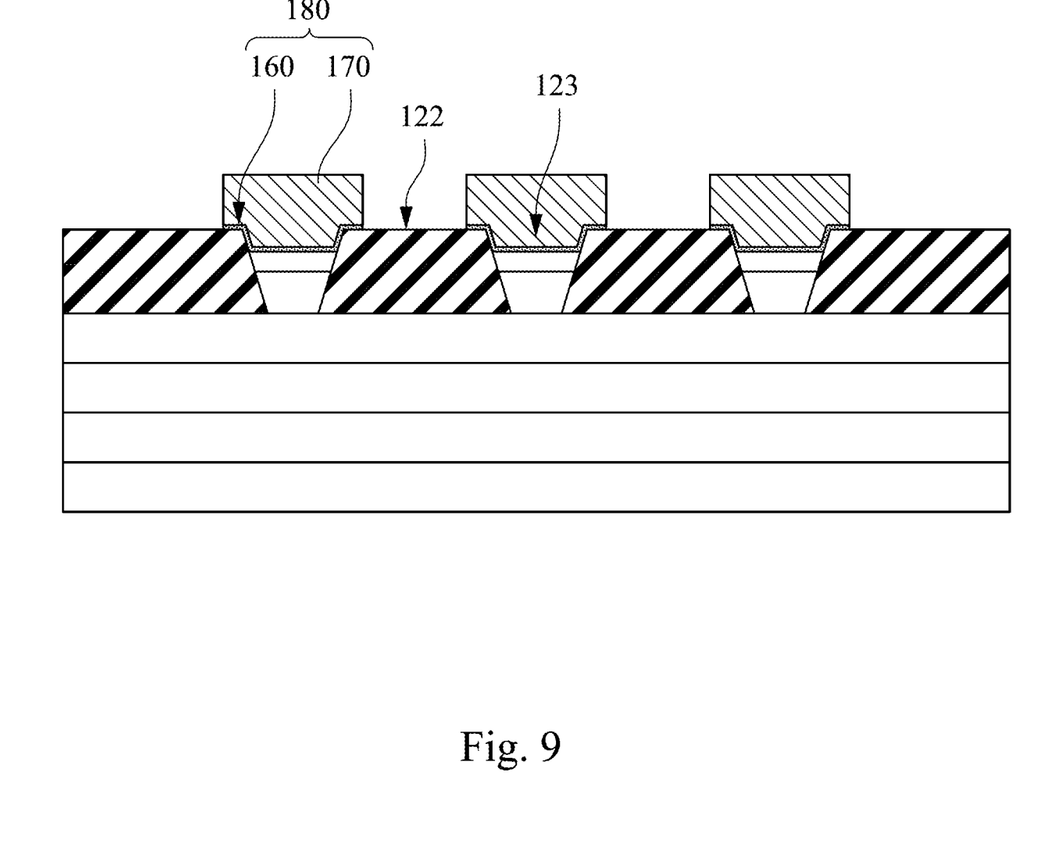

As shown in FIG. 9, the seed layer 160 exposed outside the metal block 170 is removed. Removing the seed layer 160 exposed outside the metal block 170 may include performing an etching process on the seed layer 160. The metal block 170 and the remaining seed layer 160 constitute a patterned metal layer 180. In some embodiments, the patterned metal layer 180 is made of copper. The patterned metal layer 180 extends from each of the vias 123 to a position over the second surface 122 of the resin layer 120. To further illustrate, a portion of the patterned metal layer 180 is disposed in the via 123, and another portion of the patterned metal layer 180 is disposed outside the via 123 (over the second surface 122). In other embodiments, the patterned metal layer 180 may be formed using any suitable process. That is, the method of fabricating the patterned metal layer 180 is not limited to the processes shown in FIGS. 5-9.

Figure 10:
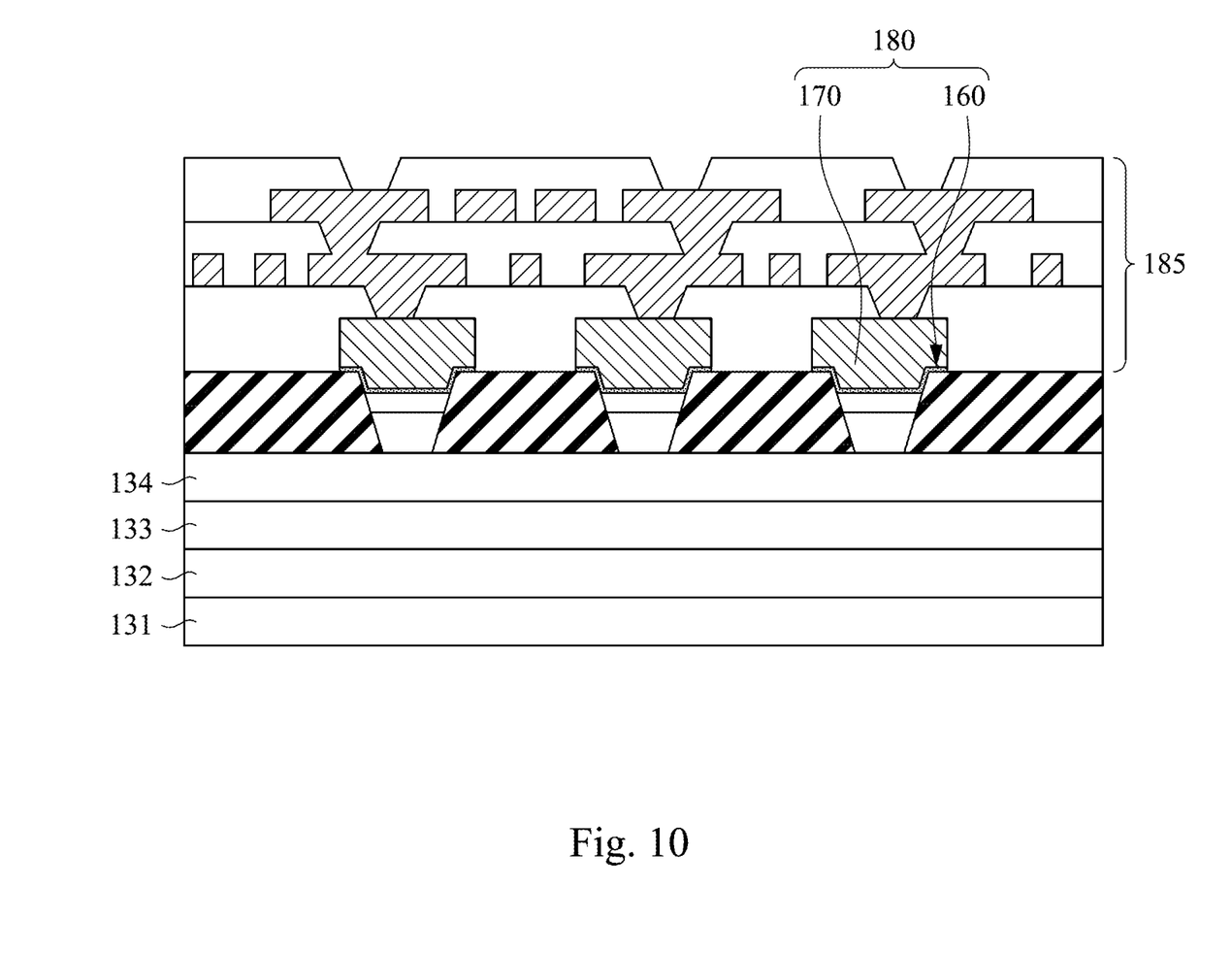

After the patterned metal layer 180 is formed, a build-up process may be performed. As shown in FIG. 10, a layer is added over the patterned metal layer 180 to form a build-up portion 185. In some embodiments, the build-up portion 185 surrounds the patterned metal layer 180, such that the patterned metal layer 180 is not etched away during subsequent etching processes. It is to be understood that the build-up portion 185 illustrated in FIG. 10 is merely an exemplary structure, and the build-up portion 185 may have a different structure as needed. In addition, the build-up process is optional, and the method of manufacturing the circuit board may not include the build-up process.

Figure 11:
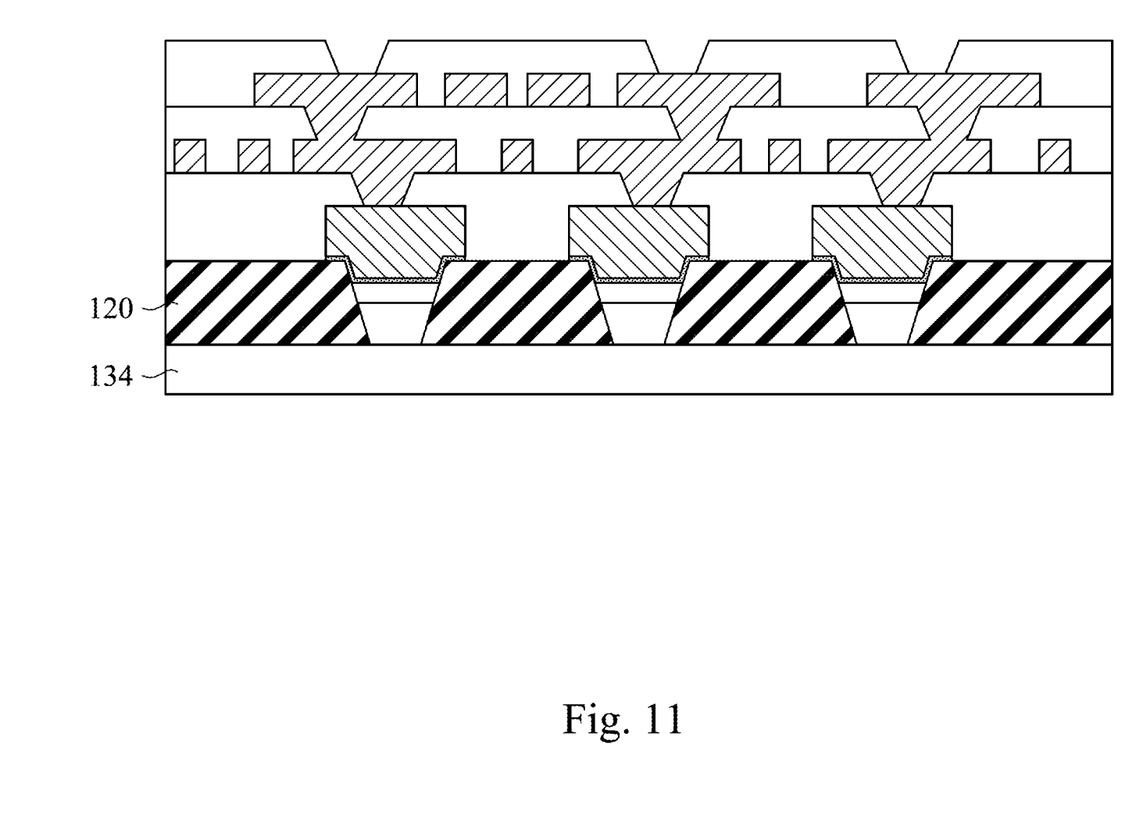

As shown in FIG. 11, the first copper layer 132 and the second copper layer 134 are separated. Since the release layer 133 is disposed between the first copper layer 132 and the second copper layer 134, the first and second copper layers 132 and 134 can be separated by the release layer 133. The separated second copper layer 134 and the resin layer 120 are still in contact with each other.

Figure 12:
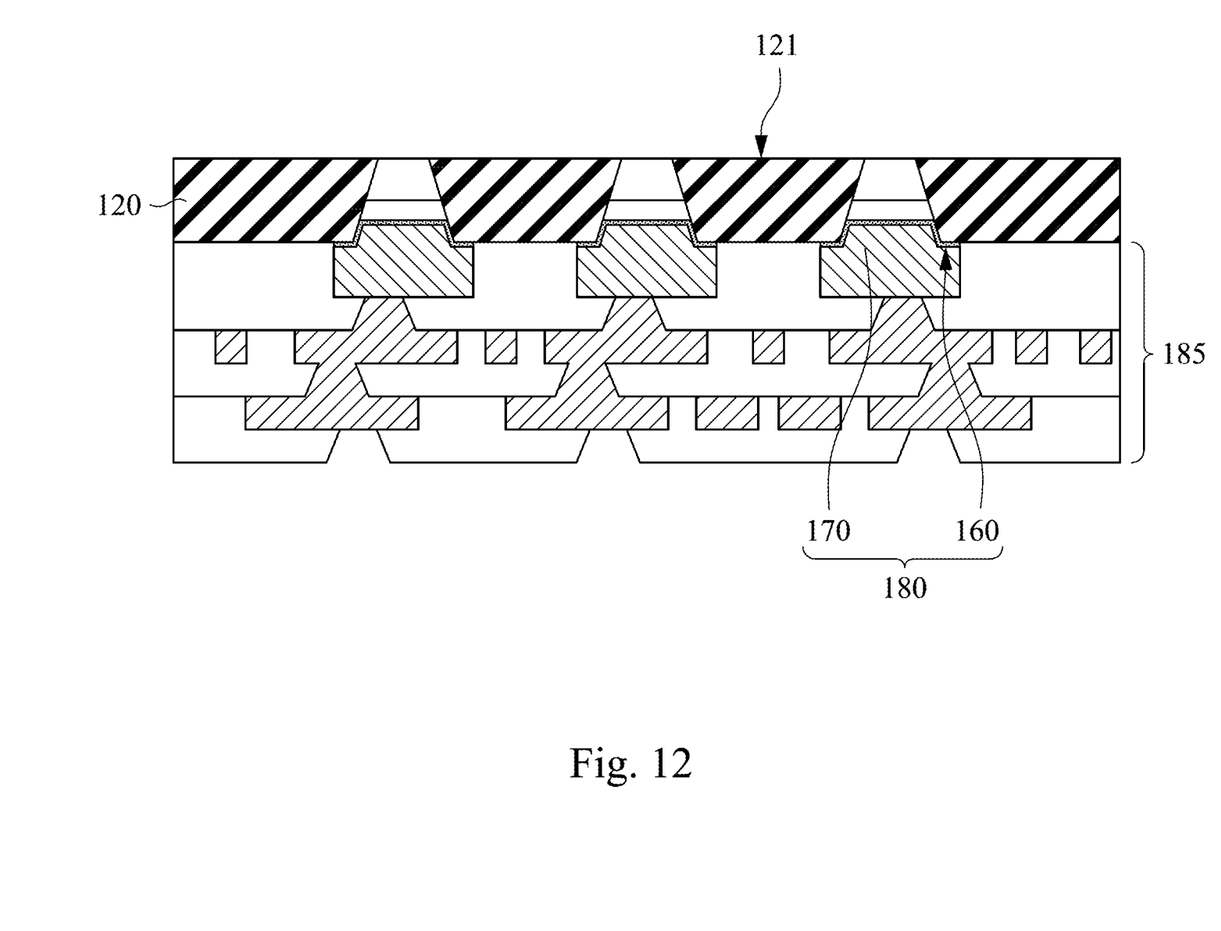

Next, as shown in FIG. 12, after the first copper layer 132 and the second copper layer 134 are separated by the release layer 133, the second copper layer 134 is etched. It is worth noting that for the sake of clarity, FIG. 12 is rotated by 180°. After etching the second copper layer 134, the first surface 121 of the resin layer 120 is exposed. Since the build-up portion 185 surrounds the patterned metal layer 180, the patterned metal layer 180 is not etched when the second copper layer 134 is etched.

Figure 13:
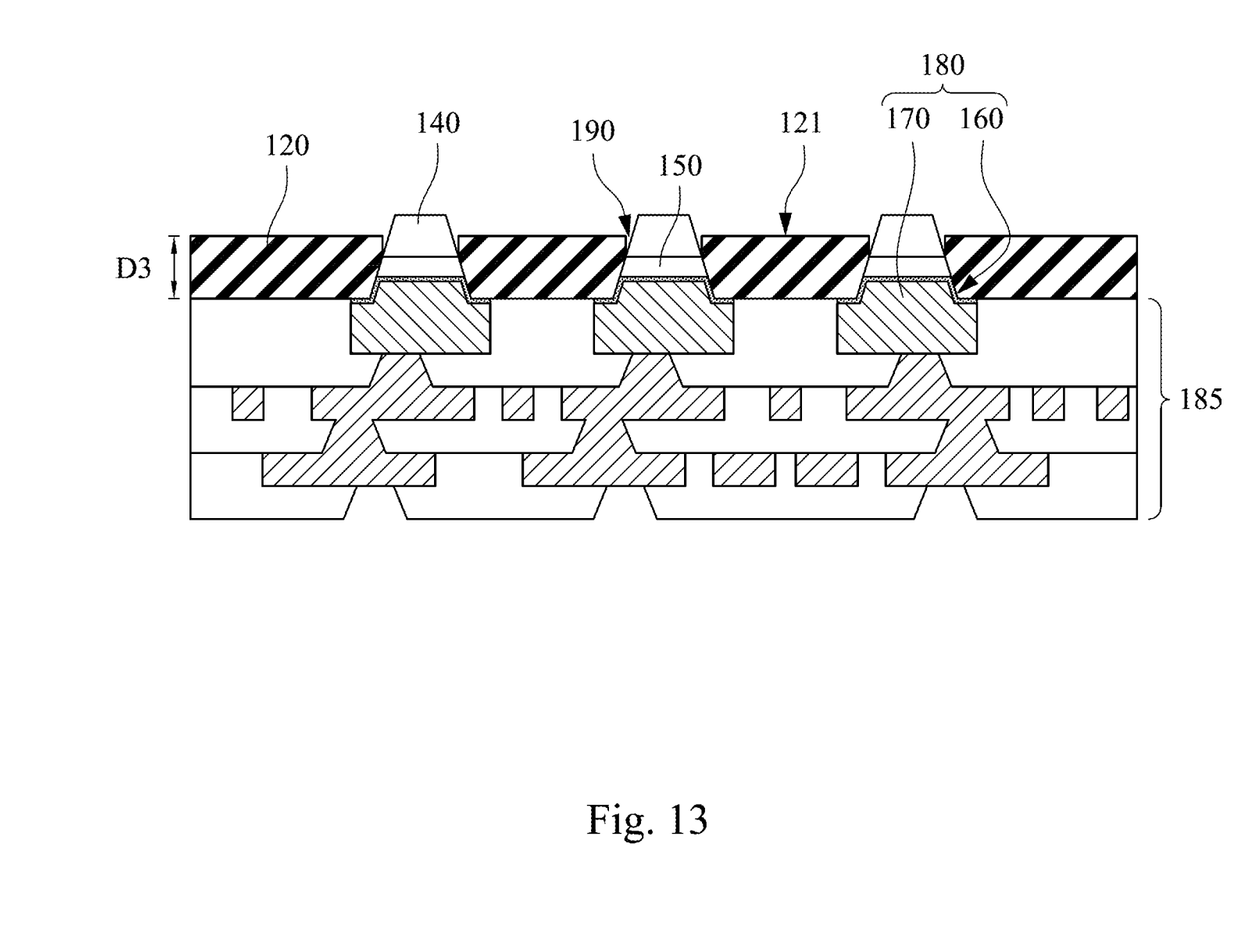

Referring to FIG. 13, a portion of the resin layer 120 is removed from the first surface 121 of the resin layer 120. In some embodiments, a portion of the resin layer 120 may be removed using an etch process. After the first surface 121 of the resin layer 120 is etched, a thickness D3 of the resin layer 120 is reduced. In other words, the resin layer 120 may be etched to expose the first metal layer 140, such that the first metal layer 140 protrudes from the resin layer 120. In some embodiments, etching the resin layer 120 includes forming a void 190 between the resin layer 120 and the first metal layer 140. The void 190 can prevent the subsequent soldering process from inadvertently electrically connecting the adjacent first metal layer 140, which is called "bridge".

Figure 14:
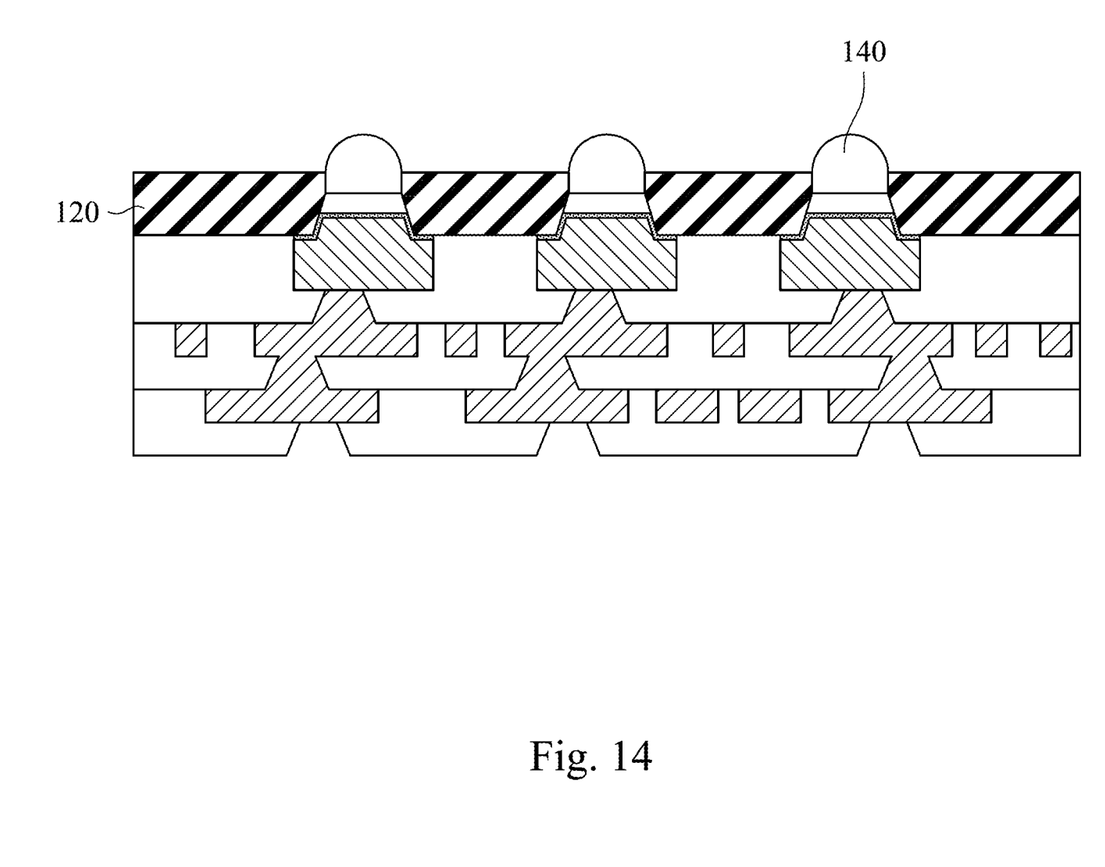

Referring to FIG. 14, the first metal layer 140 is reflowed. In some embodiments, the reflowed first metal layer 140 fills the voids 190. In other words, the voids 190 provide the space for the first metal layer 140 to flow during the reflow process to prevent the first metal layer 140 from flowing out of the vias 123, which will result in an unintended electrical connection.

The method of manufacturing the circuit board provided by the present disclosure can manufacture the circuit board with a small bump pitch. Since the operations of forming the vias, the first metal layer and the second metal layer do not include exposure development, it is not necessary to reserve the margin of the exposure alignment, so that the density of the elements can be greatly increased. In some embodiments, the pitch of the first metal layer can be reduced to 40 μm.

The present disclosure has described certain embodiments in detail, but other embodiments are also possible. Therefore, the spirit and scope of the appended claims should not be limited to the embodiments described herein.

Although the disclosure has been disclosed in the above embodiments, it is not intended to limit the disclosure, and it may be altered or modified without departing from the spirit and scope of the disclosure. The scope of protection shall be subject to the definition of the scope of the patent application attached.

What is claimed is:

1. A method of manufacturing a circuit board, comprising:
   providing a substrate, the substrate comprising a bottom layer and a resin layer over the bottom layer, the resin layer comprising a first surface and a second surface opposite to the first surface, the first surface in contact with the bottom layer;
   forming a plurality of vias through the resin layer;
   depositing a first metal layer in the vias, the first metal layer in contact with the bottom layer and filling a portion of each of the vias;
   depositing a second metal layer over the first metal layer, the second metal layer disposed in the vias;
   forming a patterned metal layer over the second metal layer, wherein the patterned metal layer extends from each of the vias to a position over the second surface;
   separating the bottom layer and the resin layer; and
   removing a portion of the resin layer from the first surface, so that the first metal layer protrudes from the resin layer.

2. The method of manufacturing the circuit board of claim 1, wherein the bottom layer comprises a core layer, a first copper layer, a second copper layer and a release layer, wherein the first copper layer is over the core layer, and the release layer is over the first copper layer, and the second copper layer is over the release layer, and the resin layer is over the second copper layer.

3. The method of manufacturing the circuit board of claim 2, wherein the operation of separating the bottom layer and the resin layer comprises separating the first copper layer and the second copper layer by the release layer.

4. The method of manufacturing the circuit board of claim 3, wherein the second copper layer is etched after separating the first copper layer and the second copper layer by the release layer.

5. The method of manufacturing the circuit board of claim 1, wherein an aperture size of each of the vias adjacent to the first surface is smaller than an aperture size of each of the vias adjacent to the second surface.

6. The method of manufacturing the circuit board of claim 1, wherein forming the vias is conducted by laser drilling or exposure development.

7. The method of manufacturing the circuit board of claim 1, wherein the operation of etching the resin layer comprises forming a void between the resin layer and the first metal layer.

8. The method of manufacturing the circuit board of claim 7, further comprising reflowing the first metal layer after etching the resin layer.

* * * * *